United States Patent [19]

Tyler

[11] 4,182,993
[45] Jan. 8, 1980

[54] SIGNAL AMPLITUDE COMPRESSION SYSTEM

[75] Inventor: Leslie B. Tyler, Newtonville, Mass.

[73] Assignee: DBX Inc., Newton, Mass.

[21] Appl. No.: 957,307

[22] Filed: Nov. 2, 1978

[51] Int. Cl.² .............................................. H03G 3/10
[52] U.S. Cl. ..................................... 330/279; 330/138; 330/280
[58] Field of Search ....................... 330/138, 279, 280; 333/14

[56] References Cited

U.S. PATENT DOCUMENTS

| | | | |
|---|---|---|---|
| 3,550,028 | 12/1970 | Dilley, Jr. et al. | 330/280 |
| 3,918,003 | 11/1975 | Seidel | 330/279 |
| 4,103,239 | 7/1978 | Meewezen | 333/14 X |

Primary Examiner—Lawrence J. Dahl
Attorney, Agent, or Firm—Schiller and Pandiscio

[57] ABSTRACT

A system for compressing an electrical input signal so that the output signal is related to the input signal in accordance with a predetermined continuous gain function exhibiting (1) fixed gain where the input signal is below a predetermined set threshold level; (2) infinite compression limiting the output to some predetermined level so that as the input increases beyond a certain input level infinite compression is provided; and (3) a soft threshold between unity gain and infinite compression. The system includes a threshold level adjustment which automatically provides a gain adjustment so that the maximum output level (preferably on an RMS basis) remains unchanged with changes in the threshold level.

27 Claims, 6 Drawing Figures

SIGNAL AMPLITUDE COMPRESSION SYSTEM

This invention relates generally to systems for conditioning electrical signals prior to transmission or recording and more particularly to signal compression systems.

In many audio signal transmission and recording media such as broadcasting, phonograph records, and recording tapes, the dynamic transmission or recording range is sufficiently limited to interfere with the enjoyment or comprehension of the signal by the listener.

It is known that in recording and transmission systems, the dynamic transmission or recording range can appear improved by using the techniques of compression, i.e., the reduction of the dynamic range of an audio signal for purpose of transmitting or recording the signal through or on the medium without loss of program information. Typically, manual gain riding is used to increase the volume in soft passages and decrease the volume in loud passages, while limiting is used to modify the dynamic range of the louder passages only.

Those types of limiters or compressors sometimes referred to as "above-threshold" devices, which are used to modify the dynamic range of the louder passages only, typically provide a fixed gain (usually unity gain) between the input and output signals so long as the input signal does not exceed a predetermined threshold setting. When the input signal does exceed the predetermined threshold setting the gain is usually reduced in some logical fashion so as to compress the input signal.

Often, the amount of compression, or more accurately the compression ratio, is fixed once the threshold level is exceeded. Thus, for example, a compressor might provide unity gain so long as the level of the input signal remains below the threshold level and a finite compression or compression ratio of, say, 4:1 when the threshold level is exceeded. Some of these compressors, such as the compressor/limiter Model 160 manufactured by DBX of Newton, Mass. are provided with an adjustment knob for adjusting the compression ratio above the threshold setting so that the ratio can vary from 1:1 (i.e., fixed gain where a 1 dB change in input provides a 1 dB change in output) to $\infty$:1 (i.e. infinite compression where any change in input level above the threshold produces virtually no change in the output level). Once the compression ratio is determined, it remains fixed throughout the compression region. This latter feature, however, does not provide optimum performance with respect to the enjoyment of signal playback by the listener.

More particularly, although a particular compression ratio may be desirable for one portion of the compression part of the input output characteristic curve, it may not be desirable for other portions of the compression part of the curve. For example, for signal levels of the input signal just above the threshold level setting, a low compression ratio would be desirable since only a small amount of compression is necessary. But with a low compression ratio setting, signals levels of the input well in excess of the threshold level would produce an output level which may exceed the desired output level for the transmission or recording medium. Conversely, increasing the compression ratio for example to provide infinite compression, will adequately compress those portions of the input signal well above the threshold level, but provide excessive compression on those input signal levels just above the threshold.

Also, in limiters such as the aforesaid Model 160, a separate adjustment is provided for setting the threshold level and for adjusting the overall gain. Adjusting the threshold setting results in a positive or negative shift in the compression part of the input-output characteristic curve, thereby modifying the overall gain in this area of operation. It is therefore necessary to adjust the overall gain of the system when adjusting the threshold level of the system.

It is an object of the present invention to provide an improved signal conditioning system.

More particularly, objects of the present invention are to provide an improved signal conditioning system of the compressor/limiter type, (1) which provides compression for signal levels above the threshold setting, the amount of compression depending upon how much the input level exceeds the threshold setting; (2) which exhibits an input-output characteristic curve which is a function having a continuous slope or first derivative and varying from a fixed gain, for input signal levels below the threshold level, to infinite compression for the maximum output level (on an average, RMS or peak basis) desired; (3) which provides a soft threshold, i.e. low compression ratios for input signals just above the threshold setting and infinite compression for input signal levels well in excess of the threshold setting; and (4) which provides automatic gain adjustment for changes in the threshold setting.

These and other objects are achieved by an improved signal conditioning system having an input-output characteristic curve which is a function having a continuous slope or first derivative, preferably exhibiting fixed gain when the level of the input signal is below the threshold level, substantially infinite compression at a maximum average output level, and a gradually increasing compression ratio between these two portions of the curve. The system is designed so that the maximum desired output level (preferably on an RMS basis) can be initially set by the listener, and the threshold level can be adjusted with the associated adjustment to the overall system gain being automatically made to maintain the maximum output level setting.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a further understanding of the nature and objects of the present invention, reference should be had to the following detailed description taken in combination with the accompanying drawings wherein.

In the drawings, the same numerals are used to designate like parts.

Figure 1:
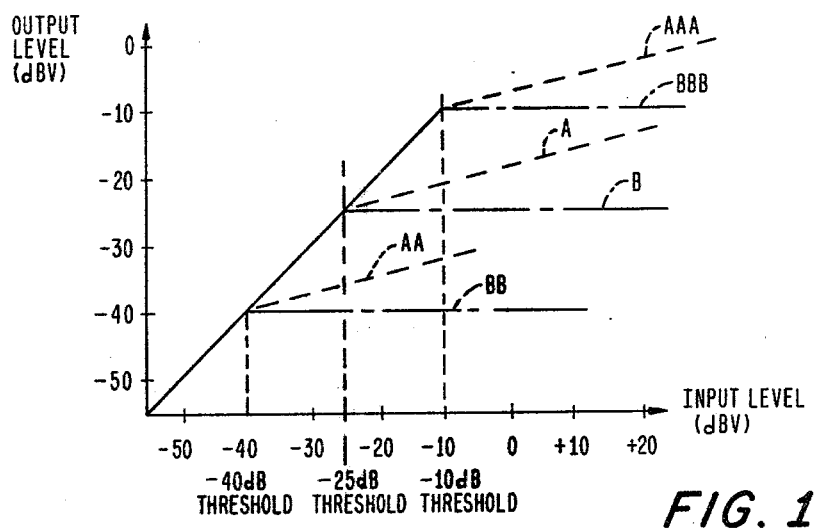
FIG. 1 is a graphical illustration of a typical input output characteristic curve of a prior art compressor/limiter.

Referring to FIG. 1, the input-output characteristic curve shown, is typical of the Model 160 Compressor Limiter manufactured by DBX, Inc. of Newton, Mass. The graph represents the static characteristics (and not the dynamic characteristics) of the device so that by way of example, where the threshold level is set for −25 dBv and the compression ratio is set at 4:1, so long as the input signal amplitude level of signal energy is below the threshold setting of −25 dBv, the system provides unity gain whereby for each 1 dB of change in input, a corresponding 1 dB of output is provided. However, as where the input signal amplitude of signal energy exceeds this threshold level setting of −25 dBv, the system provides 4:1 compression, i.e. for each 4 dB change in input level above the threshold level, a corresponding 1 dB change in output is provided as indicated by the straight line curve A. The compression ratio setting can be varied from 1:1 (where the compressed portion of the input output characteristic curve has a slope of 1 and thus is a continuation of the unity gain portion of the curve below the threshold setting) to infinite compression as shown by straight line curve B (where the compression portion of the input output characteristic curve has a slope of 0). In the latter situation, a finite change in the input level above the threshold produces no substantial change in the output level. It will be apparent from the FIG. 1 that for a setting of a 4:1 compression ratio, the discontinuity thereby formed at the intersection of line A with the unity gain portion of the curve may be such that a relatively small compression ratio for input signals just in excess of the threshold setting is adequate, but insufficient compression is provided for relatively large input signal levels well in excess of the threshold level. Similarly, a setting of infinite compression as indicated by line B, provides a discontinuous function which may provide adequate compression for relatively large input signals well in excess of the threshold setting, but too much compression just above the threshold level is undesirable.

A variable threshold setting requiring an additional adjustment to overall system gain can also be illustrated by the Model 160. The threshold setting of the Model 160 is such that the threshold level can be varied between −40 dBv and +10 dBv. As shown in FIG. 1, adjusting the threshold level, for example, to −40 dBv, results in signal compression for all input signal levels above −40 dBv. Adjusting the threshold setting in this manner essentially shifts the compression part of the curve down, as indicated by straight line curves AA and BB. The particular compression ratio at this threshold setting is, of course dependent upon the compression ratio setting. The adjustment of the threshold setting from −25 dBv to −40 dBv has the effect of decreasing the overall gain of the system in the compression region as illustrated by the downward shift of curves A and B to AA and BB, respectively. A similar but opposite result occurs when the threshold setting is raised to −10 dBv where the curves A and B shift upwardly to AAA and BBB, respectively. It has therefore been necessary to make a separate independent adjustment to compensate for this gain shift in the overall system gain, i.e. when adjusting the threshold level, one must necessarily make adjustments to the overall gain of the system in order to provide the same desired output. This will be more apparent when considering the situation where the Model 160 is set for infinite compression so as to function as an "infinite above threshold" compressor.

As an infinite above threshold compressor, the slope of the compression part of the curve, is zero so that an infinite change in input level is theoretically required to produce a finite change in the output level. Where the threshold setting is shifted from −25 dBv to −40 dBv in FIG. 1, so that the line B shifts to line BB, it may be desired to provide a maximum output value at the level set by line B. Thus, it is required to add gain, at least when the input level exceeds −25 dB. This added gain is +15 dBv. Thus, one can generally state that the amount of additional gain necessary in this type of compressor is the difference between the desired output level and the output level established by the threshold level.

The foregoing analysis is valid for infinite compression. Infinite compression is, however, psychologically undesirable for input signal levels just in excess of the threshold level. By setting the compression ratio to some finite ratio, the output level above threshold would depend upon the input level, making both indeterminate. This results in the amount of additional gain, necessary to compensate for changes in the threshold level to provide the desired output, being indeterminate.

In accordance with the present invention, the maximum desired output level is initially set. Further, the compression portion of the input/output characteristic curve is such so as to provide a gradually increasing compression ratio with increasing input level above the threshold level so as to provide "over easy" compression. Additionally, infinite compression is achieved as the output signal level approaches the desired output level setting while providing a "soft" threshold.

Figure 2:
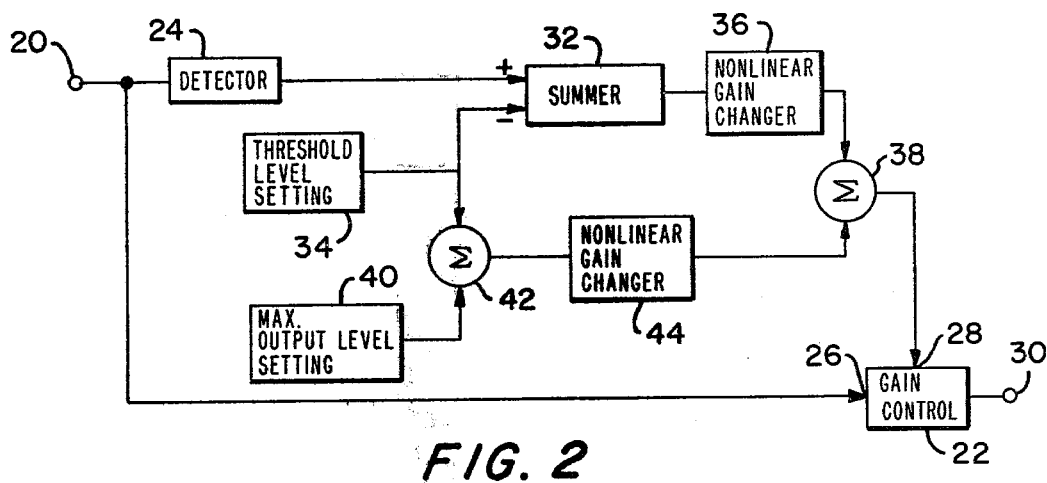
FIG. 2 is a block diagram of the preferred embodiment of the present invention.

More specifically, referring to FIG. 2, the block diagram of the preferred embodiment is generally shown as including an input terminal 20 for receiving the input electrical signal within the frequency bandwidth of interest. Terminal 20 is connected to the input of gain control module 22 and to the input of level sensing detector 24. Module 22 and detector 24 may be any type of which many are well known in the art. For example, gain control module 22 may be a voltage control amplifier such as shown and described in U.S. Pat. No. 3,714,462 issued to David E. Blackmer on Jan. 30, 1973, and the detector 24 may be of the RMS type, such as shown and described in U.S. Pat. No. 3,681,618 issued to David E. Blackmer on Aug. 1, 1972. Other types of gain control devices and detectors are well known in the art. For example, other types of multiplier circuits are useful as gain control devices, while peak and averaging detectors can be utilized if one wishes to control the peak or average level of the output, respectively.

Generally, a voltage controlled amplifier functions to impress a gain on the signal provided at the input terminal 26 the amount of gain being a function of control signal voltage provided at its control terminal 28. An increase in control voltage at the control terminal 28 decreases the gain and thereby increases the compression of the input signal applied at the input terminal 26, as it is transmitted to the output terminal 30 of the system. Detector 24 functions to provide an dynamic DC output signal the amplitude level of which is a function of the signal energy of the input signal. The output signal of detector 24 is applied to the positive input terminal of summing means, preferably in the form of a comparator or differential amplifier 32, with the negative input of the amplifier receiving a signal from the threshold setting control 34. Differential amplifier 32 generally provides an output signal equal to the signal level at the positive input terminal less the signal level at the negative input terminal so that the output is essentially a function of the difference between the input signal at terminal 20 and the level established by the setting of the threshold setting control 34. The output of differential amplifier 32 is connected to nonlinear gain changer means 36 for providing a signal output only when the output of amplifier 32 is positive. When the output of amplifier 32 and hence the input to means 36 is positive the signal output of means 36 is related to its input signal in accordance with a predetermined nonlinear function. This signal output of means 36 is applied to an input of signal algebraic summing means 38.

In order to provide gain makeup, where the maximum desired output level would otherwise shift with changes in the threshold setting, a maximum RMS output level setting control 40 is provided which provides a signal, representative of the maximum desired output level, to one input of signal algebraic summing means 42, while the signal provided by threshold level setting control 34 is applied to a second input of summing means 42. Summing means 42 adds these signals in an algebraic sense and provides an output signal level as a function of the difference between the maximum desired output level and the output level provided at the threshold level. The output of summing means 42 is fed to nonlinear gain changer means 44, the latter providing a signal output only when the maximum output level setting level set by control 40 is above the setting provided by control 34. Gain changer means 44 is designed to provide an output signal related to its input signal in accordance with substantially the same nonlinear function as provided by nonlinear gain changer means 36. It is appreciated that the output of gain changer means 44 is dependent upon the setting of controls 34 and 40 and is not dependent upon the input signal applied to input terminal 20. The output of gain changer means 44 represents essentially the necessary gain to be added in order to compensate for the difference between the maximum output level setting and the threshold setting when the former exceeds the latter. The output of nonlinear gain changer means 44 is accordingly applied to the signal algebraic summing means 38 so as to be algebraically summed with the output of gain changer means 36. The output signal summing means 38, representative of the gain change or amount of compression, to be impressed on the input signal plus the amount of gain makeup, is applied to the control terminal 28 of gain control module 22 so as to provide the appropriate gain on the input signal applied to input terminal 26 of the module.

In operation the maximum RMS output level is initially determined, typically based upon the transmission or recording system with which the present invention is being used. This, very often, is a one time adjustment made when the compressor is connected into transmission or recording system. Next, the threshold level setting control is set, dependent upon the user's preferences, to that input level of signal energy when he/she would prefer the compression to begin. Once control 34 is set, where the input signal, applied to input terminal 20, is below the threshold setting determined by control 34, the input to the positive input terminal of differential amplifier 32 is less than the input of the negative input terminal of the amplifier with the output of amplifier 32 being negative. Since gain changer means 36 functions to provide an output signal only when the output of differential amplifier 32 is of a positive polarity, the output of means 36 will be zero. The output of summing means 38 will therefore be for unity gain with an additional gain change to take into account the difference between the levels determined by the setting controls 34 and 40. The output signal at output terminal 30 of gain control module accordingly will be at a fixed gain, with no compression, with an added overall system gain between the input signal at input terminal 26 and the output signal at terminal 30 determined by the excess between the desired maximum level setting and the RMS output level determined by the threshold level.

Where the dynamics of the input signal at terminal 20 are such that the signal energy level exceeds that of the threshold, a condition where compression of the signal is desired, the output of amplifier 32 goes positive by an amount equal to the instaneous difference between the output of detector 24 and the threshold level set by control 34. This positive output of amplifier 32 is converted by gain changer means 36 in accordance with the predetermined nonlinear function before being applied to the input of summing means 38. The latter adds in the gain make-up to provide the control signal to the gain control module. The appropriate gain change or compression ratio is then impressed upon the input signal at the input terminal of module 22. It should be appreciated that as the dynamic signal energy of the input signal at terminal 20 increases above the threshold level setting, as determined by control 34, the output of gain changer means 36 increases in accordance with the predetermined nonlinear function from zero (where unity gain is provided by module 22) to a value large enough to essentially provide infinite compression. The nonlinear function chosen is such as to provide a soft threshold, and an input-output characteristic curve which is a function having a continuous slope or first derivative, as the gain of the gain control module changes from unity gain to infinite compression.

It should also be appreciated that if the threshold setting is changed by varying control 34, the necessary input level of the input signal at terminal 20 at which the output of comparator 32 will go positive will accordingly change, causing the threshold level at which the signal will be compressed to change. The shift in the threshold level and thus the gain change attributed to a shift in the compression region of the input-output characteristic curve which otherwise would have occurred with the adjustment of control 34, will automatically be compensated for by a change in the diffference between the output of control 40 and control 34. This latter change produces a change in the output of summing means 42 which in turn produces a corresponding change in the output of gain changer means 44. The amount of gain makeup is accordingly modified and added to the output of summing means 38 and thereby provided to the control terminal 28 of module 22. The above will be more apparent with respect to the following description of the preferred embodiment of the present invention as shown in FIGS. 3A–3C.

Figure 3A:
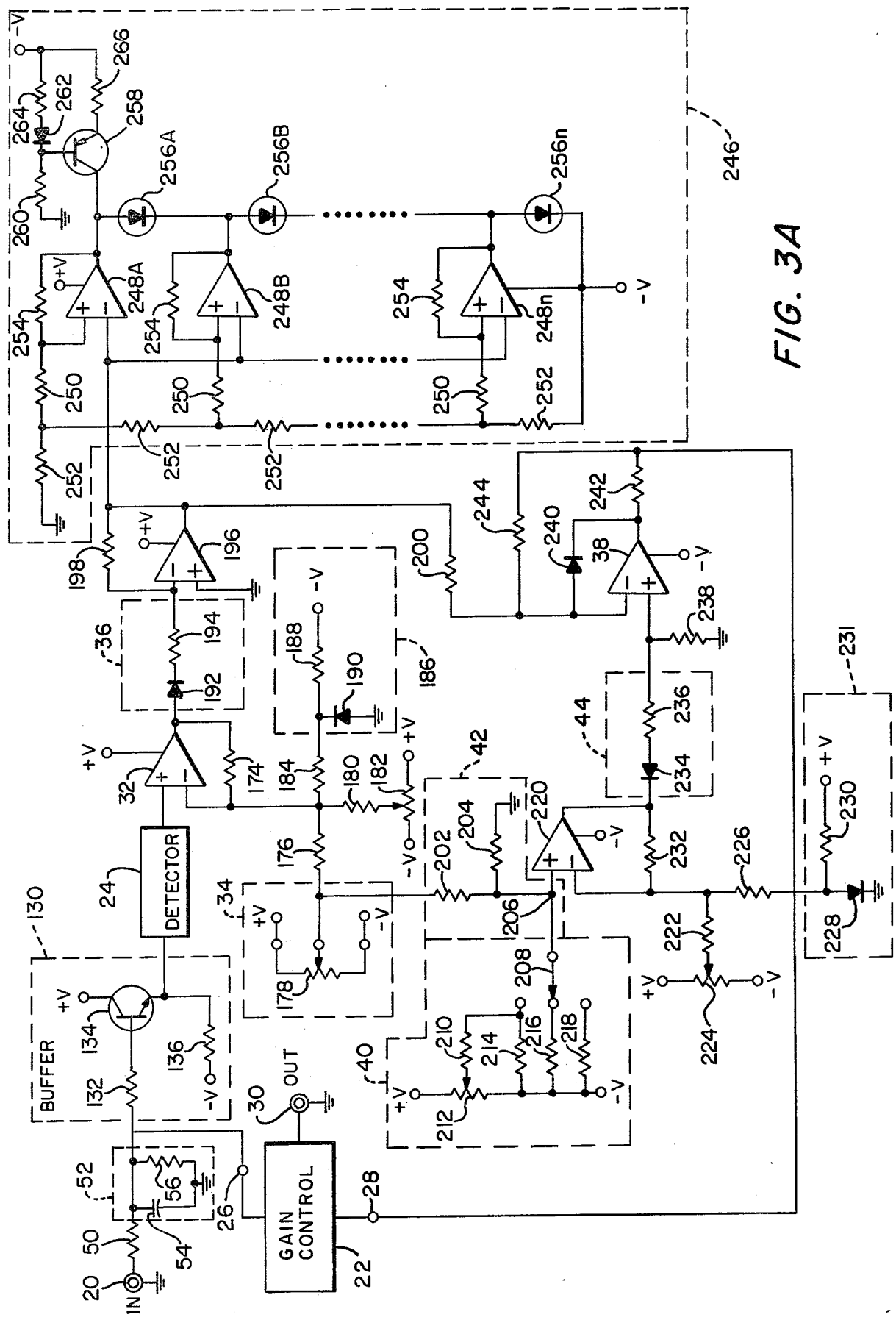
FIG. 3A is a schematic diagram of the preferred embodiment of the present invention.

Referring to FIG. 3A, the preferred embodiment shown is designed for use in audio signal transmission and recording. More specifically, the system includes the input terminal 20 connected to RFI filter 52. The filter has its input connected to resistor 50 and includes capacitor 54 and resistor 56 connected in parallel with one another between the output of the filter and system ground. The output of filter 52 is connected to input terminal 26 of the module 22. The latter is preferably of the type described in U.S. Pat. No. 3,714,462 issued to David E. Blackmer on Jan. 30, 1973 and is shown in detail in FIG. 3B.

Figure 3B:
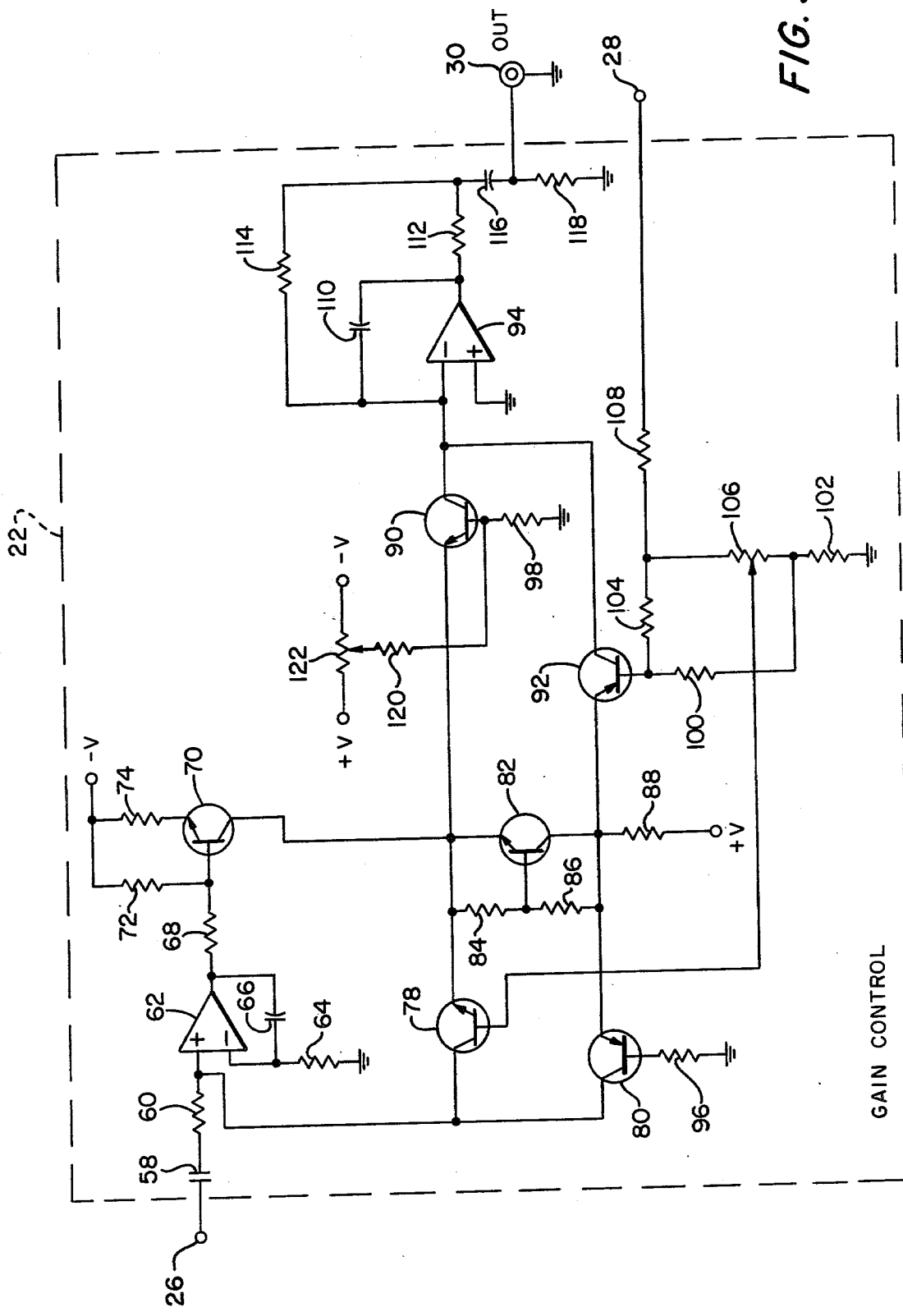
FIG. 3B is a schematic diagram of the preferred gain control module of the embodiment shown in FIG. 3A.
Figure 3C:
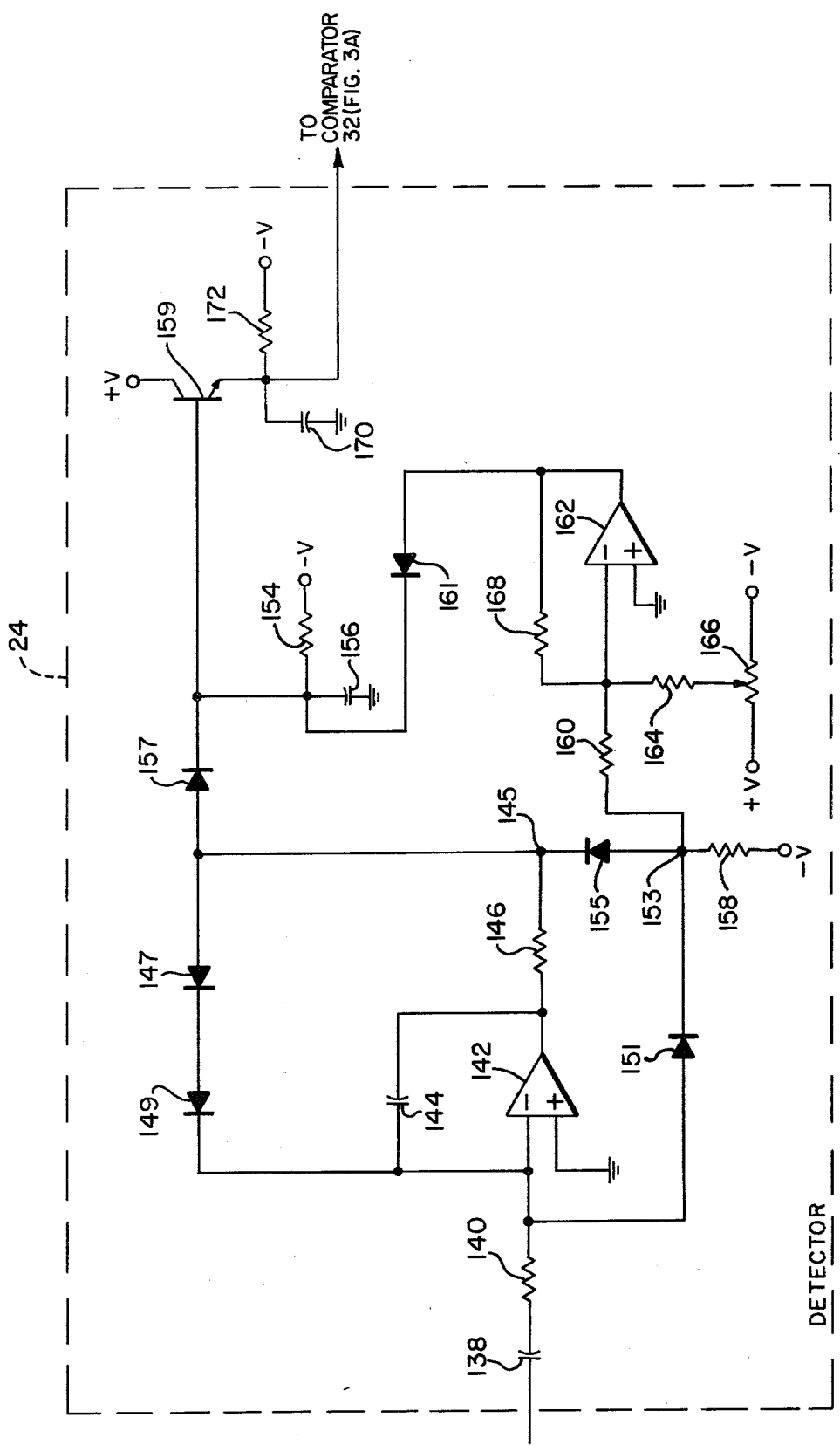
FIG. 3C is a schematic diagram of the preferred level sensing detector of the embodiment shown in FIG. 3A.

More particularly, referring to FIG. 3B, the input terminal 26 is connected through coupling capacitor 58 (for blocking D.C. signals) and resistor 60 to the positive input terminal of operational amplifier stage 62. The latter has its negative input connected through resistor 64 to ground and through feedback capacitor 66 to its output terminal. The output of stage 62 is connected through resistor 68 to the base of npn transistor 70. A negative biasing voltage is applied through resistor 72 to the base of transistor 70 and through resistor 74 to the emitter of transistor 70. Module 22 further includes two feedback paths (one for each polarity of the input signal) of stage 62 for providing a signal representative of the logarithm of the input signal. These feedback paths are formed by the collector-emitter paths of log-converting transistors 78 and 60. Specifically, the collectors of transistors 78 and 80 are connected to the positive input of amplifier stage 62, with the emitter of transistor 78 connected directly to the collector of transistor 70. The emitter of transistor 80 is connected through a voltage biasing circuit to the collector of transistor 70. The voltage biasing circuit is formed by connecting the emitter and collector of transistor 82 respectively to the emitters of transistors 78 and 80, connecting the voltage divider formed by resistors 84 and 86 between the emitters of transistors 78 and 80, connecting the base of transistor 82 between resistors 84 and 86 and biasing the collector of transistor 82 by applying a positive potential through resistor 88 to the collector of transistor 82.

Module 22 also includes two antilog-converting core transistors 90 and 92, for converting the signal appearing on the respective emitters of transistors 78 and 80 into their antilog. The antilog conversion is provided by the emitter-collector path of the transistors 90 and 92 so that the emitter of transistor 90 is connected to the emitter of transistor 78 while the emitter of transistor 92 is connected to the emitter of core transistor 80. The collectors of transistors 90 and 92 are connected together and to the negative input terminal of operational amplifier 94. Transistors 78 and 90 are preferably matched npn transistors for processing positive polarity signals appearing at the input terminal 26 and transistors 80 and 92 are preferably matched pnp transistors for processing negative polarity signals appearing at terminal 26. The bases of transistors 80 and 90 are biased to ground through resistors 96 and 98, respectively. Further, the base of transistor 90 is connected through resistor 120 to the tap of the voltage biased potentiometer 122, the latter being provided to insure symmetry of transistors 78, 80, 90 and 92. The base of transistor 92 is connected to resistor 100, which in turn is connected through resistor 102 to ground. The base of transistor 92 is also connected to resistor 104. Resistor 104 is connected to the potentiometer resistor 106 which in turn is connected through resistor 102 to ground and through resistor 108 to the control signal terminal 28 of the module 22. The base of log converting core transistor 78 is connected to the tap of potentiometer resistor 106.

Operational amplifier 94 has its positive input terminal grounded. Its output terminal is connected through feedback capacitor 110 to its negative input terminal and directly to output resistor 112. The latter is, in turn, connected through feedback resistor 114 to the negative input terminal of operational amplifier 94 and through capacitor 116 to the output terminal 30 of module 22. Output terminal 30 is connected through resistor 118 to system ground.

As well known in the art, when a signal appears at the input terminal 26 of module 22, the signal is converted to a log signal by the feedback paths provided by the collector-emitter paths of transistors 78 and 80. Simultaneously, the control signal appearing at control terminal 28 is added in an algebraic sense to the log signal by virtue of the fact that it will be added (when positive gain is provided) or subtracted (when negative gain is provided) to the base-emitter voltage of transistors 78 and 92. Since the signals are in the log domain, when the added signals are converted by the antilog-converting transistor 90 and 92, the resulting signal at the input of amplifier 94 and thus the signal appearing at the output terminal 30 will be at a value which is a function of the input signal multiplied by the control signal. As will be more evident hereinafter, the control signal applied to terminal 28 varies depending upon the sensed signal amplitude of the input signal, the threshold setting and the maximum desired output level setting.

More specifically, referring again to FIG. 3A, the output of filter 52 is connected to the input resistor 132 of buffer 130. Resistor 132 is in turn connected to the base of transistor 134 of the buffer. Transistor 134 has its collector connected to a positive reference potential. Its emitter is connected through resistor 136 to a negative reference potential and directly to the input of detector 24.

Detector 24 is known in the art such as the RMS detector of the type described in U.S. Pat. No. 3,681,618 issued to David E. Blackmer on Aug. 1, 1968. As shown in detail in FIG. 3C, the input of the preferred detector 24 includes input capacitor 138 connected in series with input resistor 140. The latter, in turn, is connected to the negative input terminal of operational amplifier 142. The positive input terminal of amplifier 142 is connected to system ground and the output of the amplifier is connected through feedback capacitor 144 to its negative input terminal and through resistor 146 to junction 145. Junction 145 is connected to the anode of diode 147, which in turn has its cathode connected to the anode of diode 149, the latter having its cathode connected to the negative input terminal of amplifier 142. The negative input terminal of amplifier 152 is connected to the anode of diode 151, which in turn has its cathode connected to junction 154. Junction 154 is connected to the anode of diode 155, which in turn has its cathode connected to junction 145. Junction 153 is also connected through resistor 158 to a negative potential and through resistor 160 to (1) the negative input terminal of operational amplifier 162 and (2) resistor 164, resistor 164 being in turn connected to the tap of voltage biased potentiometer 166. The positive input terminal of amplifier 162 is grounded. The output of amplifier 162 is connected through feedback resistor 168 to its negative input terminal and directly to the anode of diode 161. The latter has its cathode connected, together with the cathode of diode 157, (1) to the base of transistor 159, (2) to ground through capacitor 156, and (3) to a negative voltage reference potential through resistor 154. The collector of transistor 159 is connected to a positive reference potential while the emitter forms the output of the detector.

The output of the detector is connected (1) to ground through capacitor 170, (2) to a negative potential bias through resistor 172, and (3) directly to the positive input terminal of comparator 32. As well known in the art, generally, the output of the preferred detector 24 provides to the positive input terminal of difference amplifier 32, a signal which is a function of the RMS amplitude of the input signal to the detector provided by buffer 130.

Referring again to FIG. 3A, difference amplifier 32, for comparing the input signal level with the threshold setting provided by control 34, has its output connected through feedback resistor 174 to its negative input terminal. The negative input terminal is connected to the resistor 176 of control 34 which in turn is connected to the tap of voltage biased potentiometer 178 of control 34 and to algebraic summing means 42. The negative input terminal of amplifier 32 is also connected (1) through resistor 180 to the tap of voltage biased potentiometer 182; and (2) through resistor 184 to the temperature compensating means 186 for compensating temperature variations in gain changer means 36. Specifically, resistor 184 is connected to a negative reference potential through resistor 188 and to the cathode of diode 190, of means 186, the diode having its anode connected to system ground. The diode provides a temperature compensating signal.

The output of difference amplifier 32 is connected to the anode of diode 192 of gain changer means 36, the cathode of diode 192 being connected to resistor 36 of the gain changer means. The output of gain changer means 36 is connected to the negative input terminal of operational amplifier 196 having its positive input terminal connected to system ground and its output terminal connected through feedback resistor 198 to its negative input terminal. Amplifier 196 functions to invert the signal at its negative input terminal and to provide a predetermined gain as determined by the value of resistor 198 in conjunction with gain changer means 36. The output of amplifier 196 is connected through resistor 200 to the negative input terminal of difference amplifier 38. The positive input terminal of amplifier 38 receives a signal level representative of the difference between the maximum desired level and the threshold level as determined by controls 34 and 40.

Specifically, the junction formed by resistor 176 and the tap of potentiometer 178 of control 34 is connected to resistor 202 of algebraic summing means 42. Resistor 202 together with resistor 204 (connected between resistor 202 and system ground) forms a voltage divider. The junction 206 formed by the connection of resistors 202 and 204 is connected through single pole three throw switch 208 of control 40. One contact of switch 208 is connected through resistor 210 to the tap of voltage biased potentiometer 212 and through resistor 214 to a negative reference potential. The second and third contacts of switch 208 are connected, respectively, through resistors 216 and 218 to the negative reference potential.

Junction 206 is also connected to the positive input terminal of operational amplifier 220. Operational amplifier 220 is preferably a differential amplifier having its negative input terminal connected (1) through resistor 222 to the tap of the voltage biased potentiometer 224; (2) through resistor 226 to the anode of another temperature compensating diode 228 (the cathode of diode 228 being connected to system ground of temperature compensating means 231) and (3) through resistor 230 of temperature compensating means 231 to a positive reference potential. The output of amplifier 220 is connected to its negative input terminal through feedback resistor 232 and to gain changer means 44. The latter preferably includes a diode 234 having its cathode connected to the output of amplifier 220 and its anode connected to resistor 236. The resistor 236 of the means 44 is in turn connected to the positive input terminal of algebraic summing means 38. Means 38 is preferably an operational amplifier having its positive input biased to ground by resistor 238 and includes feedback diode 240, the latter having its anode connected to the negative input terminal and its cathode connected to the output terminal of the operational amplifier 38. The output of amplifier 38 is connected to output resistor 242, which in turn is connected to (1) feedback resistor 244 which in turn is connected to the negative input terminal of the amplifier, and (2) to the control terminal 28 of the gain control module 22.

In order to provide a visual indication of the amount of gain change and thus compression being provided by the present invention, the output of amplifier 196 is preferably connected to meter 246. Meter 246 includes a plurality of comparators 248A . . . 248n, each having its negative input terminal connected to the output of amplifier 196. The positive input of each comparator 248 is connected through an input resistor 250 to a resistor ladder defined by resistors 252 which are biased by a negative reference potential so as to provide a successively increasing voltage potential input to the positive inputs of successive comparators 248, beginning with comparator 248A. Each comparator 248 is also provided with a feedback resistor 254 connecting the output of each comparator to its own positive input terminal to provide positive feedback. The output of each amplifier is connected to the anode of a light emitting diode (LED) 256 which in turn has its cathode connected to the output of their next succeeding comparator 248 and the anode of the next succeeding LED. The last diode 256n has its cathode connected to the negative reference potential as shown. The diodes 256 are biased by connecting the anode of diode 256A to the collector of transistor 258. The base of transistor 258 is connected through resistor 260 to system ground and to the cathode of diode 262. The anode of diode 262 and the emitter of transistor 258 are connected through resistors 264 and 266, respectively to a positive reference potential.

In the operation of the FIG. 3 embodiment control 40 is initially set so as to establish the maximum RMS output 1vel. This is, in part, determined by the audio recording or transmission system with which the present invention is utilized. The setting of switch 208 of control 40 determines this value. In the preferred embodiment, the switch when set on the contact connecting the switch through (1) resistor 218 establishes a maximum of +4dBm (a value typically for professional audio systems); (2) resistor 216 establishes a maximum of −10dBm (a value typically for amateur audio systems); and (3) resistors 210 and 214 establishes an adjustable maximum depending upon the setting of potentiometer 212. This usually is a one time setting by the user when connecting the compressor of FIG. 3 into an audio system. This setting establishes a DC voltage offset at junction 206. The desired threshold setting is set by adjusting the control 34, and in particular adjusting the potentiometer 178 to the desired level. This latter adjustment establishes the voltage level applied through the voltage divider of summing means 42 to junction 206 as well as the voltage level applied through resistor 176 to the negative input terminal of difference amplifier 32.

With respect to the signal level at the negative input terminal of amplifier 32 the temperature compensation means 186, which includes diode 190, provides an output signal through resistor 184 to the negative input terminal of amplifier 32 to provide compensation for any variations in the operation of diode 192 of gain changer means 36, due to temperature changes. This, however, assumes that diodes 190 and 192 have exactly the same operating characteristics. As a practical matter however, diodes 190 and 192 may be difficult to match. Accordingly, adjustment of potentiometer 182 to adjust the signal level at the negative input terminal of amplifier 32 provides the necessary adjustment to compensate for any biasing differences between the diodes. Further, proper adjustment of potentiometer 182 compensates for uncertainties presented by tolerances of the component parts of detector 24. The signal applied to the negative input terminal of difference amplifier 32 is therefore established by the threshold level set by potentiometer 178 with temperature compensation and tolerance adjustments provided by means 186 and potentiometer 182.

The signal level at junction 206 and thus at the positive input terminal of amplifier 220 is representative of the difference between the maximum output level (as set by control 40) and threshold level (as set by control 34). This signal level, however, is also offset by a compensating signal, the latter being provided at the negative input terminal of amplifier 220. Specifically, temperature compensation means 231, which includes diode 228 provides an output signal through resistor 226 to the negative input terminal of amplifier 220 to provide compensation for any variations in the operation of diode 234 of gain changer means 44 due to temperature variations. Since diodes 228 and 234 may not be matched in their operating characteristics, adjustment of potentiometer 224 to adjust the signal level at the output of amplifier 220 provides the necessary adjustment to compensate for any biasing differences between the diodes. Further the adjustment of potentiometer 224 also can compensate for uncertainties arising from the tolerances of the components of control 40.

It should be appreciated that the signal levels at the input terminals of amplifier 220 are such that the output of amplifier 220 is always negative so long as the threshold level setting of control 34 is less than the maximum output setting of control 40. When the output of amplifier 220 is of a negative polarity, diode 234 is forward biased. The greater the difference between the settings of controls 34 and 40, the greater the magnitude of the negative output signal of amplifier 220 resulting in the signal at the positive input of the operational amplifier of summing means 38 to go more negative, thereby adding a negative signal of proportional magnitude to the output of the operational amplifier.

When the incoming audio signal is applied to input terminal 20, filter 52 passes the frequency passband of interest, i.e., the audio spectrum, to the buffer 130 and to the input terminal 26 of the gain control module. The signal at terminal 26 is converted by the feedback paths defined by core transistors 78 and 80 to signals having a log relationship with the input signal. The control signal at control terminal 28 is added to the base-emitter voltages of the transistors 78 and 92 to provide either gain or loss depending on the RMS value of the signal at the input terminal 26 and the difference between the threshold setting means 34 and the maximum output setting means 40.

The signal applied to the input terminal 20 is also simultaneously applied to the input of buffer 130. The signal applied to buffer 130 is divided by transistor 134 so as to provide the necessary impedance translation to detector 24. The signal applied to the input of detector 24 provides a D.C. output having an amplitude related to the RMS value of the input signal to the detector. The D.C. output is applied to the positive input of difference amplifier 32. The latter compares this D.C. output with the level established by control 34. If this D.C. output is less than the threshold setting the output of comparator 32 will be negative and diode 192 will be reverse biased. Consequently, the input and the output of amplifier 196 will be zero. With the output of amplifier 196 at zero, the output of the operational amplifier of summing means 38 will be negative (or zero) and proportional to the negative signal at the positive input terminal of summing means 38. This signal output of means 38 is applied to control terminal 28 to provide the desired gain change. It will be appreciated that this signal provided at the output of means 38 is independent of the input signal (so long as it remains below the threshold level) and is strictly dependent upon the settings of controls 34 and 40. Thus, as long as the threshold setting and maximum level output settings remain unchanged, the gain throughout the region of the input-/output characteristic curve where the input level is below the threshold level will be fixed.

Figure 4:
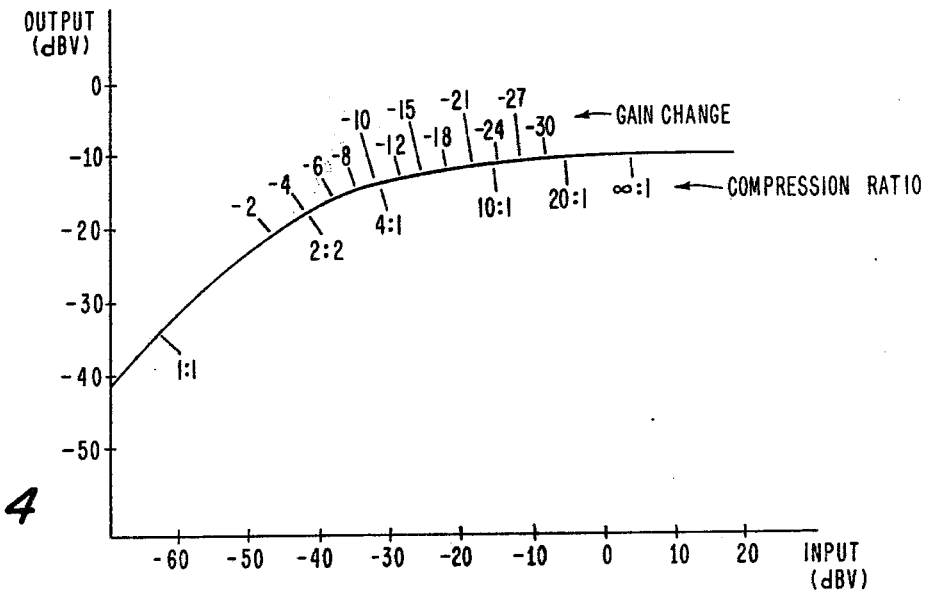
FIG. 4 is a graphic illustration of a typical input output characteristic curve of the FIG. 3 embodiment.

Specifically, as shown by way of example in FIG. 4, where the threshold setting is set as shown (−38 dBm) and the maximum output level is set at −10 dBm, so long as the input signal does not exceed the threshold level, the gain remains at −28 dB and the compression ratio remain at 1:1.

Referring again to FIG. 3A, where input signal exceeds the threshold level setting as determined by control 34, the D.C. signal output of detector 24 exceeds the signal level at the negative input terminal of amplifier 32. The output of amplifier 32 then becomes positive, providing a positive bias on diode 192. The amount of current flowing through diode 192 and thus the amplitude of the signal applied to the negative input of amplifier 196 varies as a nonlinear function, i.e., a log linear relationship arising from the forward-bias voltage-current characteristics of diode 192, of the amplitude of the positive output of the difference amplifier 32. This nonlinear signal is inverted (in a polarity sense) and amplified by amplifier 196. The gain provided by amplifier 196 is primarily provided in order to make tolerances of the components in meter 246 substantially insignificant.

The output of amplifier 196, now in a negative polarity, is applied to the negative input terminal of the operational amplifier of summing means 38. Since the signal at the negative input terminal is of a negative polarity, the output of the amplifier of summing means 38 is proportional in magnitude but opposite in polarity to the signal at the output of amplifier 196. The output of amplifier of means 38 and thus the control signal applied to control terminal 28 of the gain control module 22 is the addition of the gain change as determined by gain changing means 36 and the difference between the maximum output setting and threshold setting as determined by gain changing means 44. (In this regard diode 234 of gain changer means 44 converts the signal output of amplifier 220 in accordance with substantially the same nonlinear function as that provided by diode 192 of the gain changer means 36 due to the fact that the forward bias voltage current characteristics of diode 234 are substantially matched to those of diode 192). The more the input signal exceeds the threshold signal the greater the gain change and compression. As shown in FIG. 4, the more the input signal level exceeds the threshold level, the greater the amount of gain change and compression provided. Of importance the input-output characteristic curve shown in FIG. 4 is a function which has a continuous slope or first derivative. Infinite compression is achieved at the predetermined output level set by control 40 with a soft threshold occurring between the 1:1 compression region and the infinite compression region of the curve.

The amount of gain change that occurs at any one instance is visually indicated by LEDs 256 of meter 246. Specifically, the output of amplifier 196 is applied to the negative input terminals of comparators 248. Since the resistor ladder comprising resistors 252 provides an increasing negative potential on the positive input terminal of each succeeding amplifier 248, the number of comparators providing a positive output signal will vary with the amplitude of the signal output from amplifier 196. Each comparator 248 providing a positive output signal will forward bias the LED 256 to whose anode the output of the amplifier is connected. Thus, by way of example, LED 256A may illuminate where the gain change is −2, LEDs 256A and 256B may illuminate when the gain change is −4, etc.

Should it be desired to adjust the threshold level setting by adjusting potentiometer 178 of control 34, the signal at junction 206 and thus at the positive input terminal of amplifier 220 will change. This change causes the reverse bias across diode 234 of gain changing means 44 to change to provide the necessary gain change between the maximum RMS output level and the new threshold setting. Further, the change in threshold setting will be reflected by a change of signal level at the negative input terminal of difference amplifier 32 so that the necessary gain reduction or compression will be provided when the input signal exceeds the new threshold level. However, since the maximum output setting remains the same, infinite compression will still occur for output signals of that RMS level regardless of the threshold setting. Thus, at the new threshold setting, a soft threshold is still provided, the input/output characteristic curve remains a function having a continuous slope of first derivative and infinite compression occurs at the maximum output setting as determined by the setting of control 40.

Although the invention has been described in its preferred embodiment it will be evident that various changes can be made without departing from the invention. For example, although the preferred detector employed is an RMS detector so that the maximum output level limit is on an RMS basis it should be understood that other detectors, such as peak and averaging detectors, can be employed so that the maximum average output level is respectively on a peak or averaging basis. Further, although diodes 192 and 234 are utilized for their forward bias voltage current characteristics in shaping the input output characteristic curve of FIG. 4, other unidirectional current conducting means can be used. For example, the collector-emitter path of a transistor connected to provide unidirectional conduction will also work.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A system for processing an input electrical signal thereto to provide an output signal, said system comprising, in combination:
   means for establishing a first predetermined amplitude level of signal energy;
   means for establishing a second predetermined amplitude level of signal energy; and
   gain control means for controlling the gain in said system between said output and input signals in accordance with a predetermined function, said gain control means including;
   (a) means for comparing the signal energy of said input signal with said first predetermined amplitude level;
   (b) means for substantially limiting the signal energy of said output signal so that the latter cannot exceed said second predetermined amplitude level, and
   (c) means, responsive to said means for comparing and said means for limiting, for providing (1) said gain as a first value which is a constant function between said output and input signals when the amplitude level of signal energy of said input signal is less than said first amplitude level; (2) said gain as a function so as to provide substantially infinite compression of said input signal when the amplitude of signal energy of said output signal is substantially equal to said second predetermined amplitude level; and (3) said gain at a second value less than said first value, and which second value varies as a function dependent upon the amplitude of signal energy of said input signal when the latter amplitude is greater than said first predetermined amplitude level and the amplitude of said output signal is less than the said second predetermined amplitude level.

2. A system according to claim 1, wherein said means for limiting said output signal so that the latter cannot exceed said second predetermined amplitude level is on an RMS basis.

3. A system according to claim 1, wherein said gain control means comprises sensing means for sensing the RMS amplitude of said input signal and for providing a variable DC signal logarithmically related to said RMS amplitude of said input signal.

4. A system according to claim 1, wherein said gain control means comprises sensing means for sensing the amplitude of said input signal and for providing a variable DC signal as a function of the amplitude of said input signal.

5. A system according to claim 4, wherein said means for comparing is connected for comparing said DC signal with said first predetermined amplitude level, and includes means for generating a first electrical signal when the amplitude level of said control signal exceeds said first predetermined amplitude level.

6. A system according to claim 5, wherein said means for generating is adapted to provide said first electrical signal as a first nonlinear function of the difference between said D.C. signal and said first predetermined amplitude level.

7. A system according to claim 6, wherein said means for limiting includes means for comparing said first and second predetermined amplitude levels and for generating a second electrical signal as a second function of the difference between said second amplitude level and said first amplitude level.

8. A system according to claim 7, wherein said second nonlinear function is substantially identical to said first nonlinear function.

9. A system according to claim 8, wherein diode means is connected in said system so that said first and second nonlinear functions are each determined by the forward bias, voltage-current characteristics of a corresponding one of said diode means.

10. A system according to claim 7, wherein said means responsive to said means for comparing and means for limiting, comprises means for generating a control signal as a function of the sum of said first and second electrical signals, and amplification means coupled for amplifying said input signal by a gain variable responsively to said control signal.

11. A system according to claim 10, wherein said amplification means includes a voltage control amplifier.

12. A system according to claim 1, wherein said predetermined function has a continuous first derivative.

13. A signal compression system for providing a compressed electrical output signal in response to an electrical input signal when the level of said input signal exceeds a predetermined threshold level, said system comprising:
means for establishing a preselected maximum signal level of said output signal so that said system provides substantially infinite compression of said input signal when said output signal substantially equals said maximum signal level;
means for varying said predetermined threshold level;
means, responsive to said means for varying said predetermined threshold level, for generating a gain adjustment signal as a function of the difference between (1) said maximum signal level, and (2) the level of said ouput signal when the level of said input signal equals said threshold level; and
gain control means, including means at least in part responsive to said gain adjustment signal, for compressing said input signal in accordance with a predetermined gain control function, said gain control function providing substantially infinite compression of said input signal when the signal level of said output signal substantially equals said maximum signal level regardless of said difference.

14. A system according to claim 13, wherein said maximum signal level of said output signal is on an RMS basis.

15. A system according to claim 13, wherein said gain control means comprises sensing means for sensing RMS amplitude of said input signal and for providing a variable DC signal logarithmically related to said RMS amplitude of said input signal.

16. A system according to claim 13, wherein said gain control means comprises sensing means for sensing the amplitude of said input signal and for providing a variable DC signal as a function of the amplitude of said input signal.

17. A system according to claim 13, further including means for comparing the level of said D.C. signal with said predetermined threshold level, and for generating a first electrical signal in response to and as a function of said comparison when the amplitude level of said D.C. control signal exceeds said threshold level.

18. A system according to claim 17, further including means for generating a gain control signal as a function of said gain adjustment signal and said first electrical signal; said gain control means further including amplification means for amplifying said input signal by a gain variable responsively to said gain control signal.

19. A system according to claim 18, wherein said amplification means includes a voltage control amplifier.

20. A system according to claim 17, wherein said first electrical signal is related as a first nonlinear function to the difference between the level of said D.C. signal and said threshold level.

21. A system according to claim 20, wherein said means for generating said gain adjustment signal includes means for comparing the maximum signal level of said output signal and the output signal level at said predetermined threshold level, wherein said means for generating said gain adjustment signal generates said gain adjustment signal in response to said comparison.

22. A system according to claim 21, wherein said gain adjustment signal is related as a second nonlinear function to said comparison, wherein said first and second nonlinear functions are substantially equal.

23. A system according to claim 22, wherein said first and second nonlinear functions are each determined by the forward bias, voltage-current characteristics of a diode.

24. A system according to claim 13, wherein said predetermined gain control function is a continuous function.

25. A system according to claim 24, wherein said gain control function is such that said gain control means provides (1) constant gain as a linear function between said output and input signals when the amplitude level of signal energy of said input signal is less than said threshold level; (2) substantially infinite compression when the amplitude signal level of signal energy of said output signal is substantially equal to said maximum output level; and (3) a gain, less than said constant gain, which varies as a nonlinear function dependent upon the amplitude signal level of signal energy of said input signal when the amplitude signal level of said input signal is greater than said threshold level and the amplitude signal level of said output signal is less than said maximum output level.

26. A system according to claim 25, wherein said gain control function has a continuous first derivative.

27. A system according to claim 25, wherein said maximum output level is on an RMS basis.

* * * * *